(12) United States Patent
Asano et al.

(10) Patent No.: US 7,358,646 B2
(45) Date of Patent: Apr. 15, 2008

(54) PIEZOELECTRIC ACTUATOR (75) Inventors: Hiroaki Asano, Yokkaichi (JP); Shinichi Okamoto, Kariya (JP)

(73) Assignee: Denso Corporation (JP)

( * ) Notice: Subject to any disclaimer, the term of this patent is extended or adjusted under 35 U.S.C. 154(b) by 76 days.

(21) Appl. No.: 10/315,036

(22) Filed: Dec. 10, 2002

(65) Prior Publication Data
US 2003/0107301 A1 Jun. 12, 2003

(30) Foreign Application Priority Data
Dec. 10, 2001 (JP) ............................. 2001-376246

(51) Int. Cl.
*H01L 41/083* (2006.01)
(52) U.S. Cl. ..................... 310/328; 310/340; 310/344
(58) Field of Classification Search ............... 310/328, 310/340, 344, 348, 366
See application file for complete search history.

(56) References Cited

U.S. PATENT DOCUMENTS

| | | | |
|---|---|---|---|
| 4,958,100 A * | 9/1990 | Crawley et al. ............ 310/328 |
| 4,972,390 A * | 11/1990 | Pagliarini, Jr. .............. 367/158 |
| 5,308,382 A | 5/1994 | Prasad |
| 5,789,844 A * | 8/1998 | de Groot ...................... 310/329 |
| 6,091,183 A | 7/2000 | Nishimura et al. |
| 6,414,417 B1 | 7/2002 | Tsuyoshi et al. |
| 6,661,158 B2 * | 12/2003 | Kawazoe .................... 310/328 |
| 6,716,522 B2 | 4/2004 | Matsumoto et al. |
| 6,731,048 B2 * | 5/2004 | Kawazoe .................... 310/328 |
| 6,747,400 B2 * | 6/2004 | Maichl et al. ............... 310/332 |

FOREIGN PATENT DOCUMENTS

| | | |
|---|---|---|
| JP | 61-284350 | 12/1986 |
| JP | 2-42457 | 3/1990 |
| JP | 02-288277 | 11/1990 |
| JP | 03-256377 | * 11/1991 |
| JP | 04-349675 | 12/1992 |
| JP | 05-063496 | 3/1993 |
| JP | 06-125894 | * 5/1994 |
| JP | 6-306195 | 11/1994 |
| JP | 07-057579 | 3/1995 |

(Continued)

OTHER PUBLICATIONS

Third Party Information Offer Form dated Jun. 23, 2005 with English translation.

(Continued)

*Primary Examiner*—Thomas M. Dougherty
(74) *Attorney, Agent, or Firm*—Nixon & Vanderhye PC (57) ABSTRACT

The present invention provides a piezoelectric actuator with excellent durability. In the present invention, a piezoelectric element 2 in which a plurality of piezoelectric layers that expand in accordance with an applied voltage, and internal electrode layers for supplying an applied voltage, are alternately laminated, and at least a part of the side surfaces 201 and 202 thereof is covered by an external packaging resin 25, the piezoelectric element 2 being housed in a sealed container 11 that substantially isolates it from the external atmosphere, and in which the internal atmosphere 19 is replaced by an inert gas. Alternatively, the piezoelectric element 2 is housed in a sealed container 11 that substantially isolates it from the external atmosphere, and the external packaging resin 25 includes an antioxidant.

8 Claims, 8 Drawing Sheets

FOREIGN PATENT DOCUMENTS

| | | |
|---|---|---|
| JP | 07-202285 | 8/1995 |
| JP | 07-284198 * | 10/1995 |
| JP | 08-170070 | 7/1996 |
| JP | 9-55549 | 2/1997 |
| JP | 09-185959 | 7/1997 |
| JP | 10-009084 | 1/1998 |
| JP | 10-061474 | 3/1998 |
| JP | A 10-173247 | 6/1998 |
| JP | 2000-114113 | 4/2000 |
| JP | A-2001-69771 | 3/2001 |
| JP | 2001-102649 | 4/2001 |
| JP | 2001-143540 | 5/2001 |
| JP | 2001-189499 | 7/2001 |
| JP | 2001-205751 | 7/2001 |
| JP | 2002-203998 * | 7/2002 |

OTHER PUBLICATIONS

Japanese Official Action mailed Feb. 21, 2006 in corresponding Japanese Appln. No. 2001-376246.

Japanese Official Action mailed Aug. 10, 2006 in corresponding Japanese Appln. No. 2001-376246 with English translation.

* cited by examiner

PIEZOELECTRIC ACTUATOR

BACKGROUND OF THE INVENTION

1. Field of the Invention

The present invention relates to a piezoelectric actuator for use in positioning units for optical devices, drive elements for vibration prevention, fuel injection devices, and the like.

2. Description of the Related Art

Piezoelectric actuators using piezoelectric elements, wherein a plurality of piezoelectric layers that expand according to an applied voltage, and an internal electrode layer for supplying an applied voltage are alternately formed in a laminated structure, are known.

In a piezoelectric actuator, in order that the piezoelectric element is not affected by external influences such as moisture, impact, and the like, the side surfaces of the piezoelectric element are covered with an external packaging resin and enclosed in a sealed container.

For example, as disclosed in Examined Patent Publication (Kokoku) No. 6-28832, by enclosing an inert gas in a sealed container, deterioration due to oxidation of the internal electrode layer of a piezoelectric element is prevented and the reliability improved. Also, as disclosed in Unexamined Patent Publication (Kokai) No. 2001-102649, by covering the side surfaces of a piezoelectric element with an external packaging resin, the moisture resistance of the piezoelectric element is improved.

However, sufficiently preventing deterioration of the piezoelectric element of a piezoelectric actuator used under severe environmental conditions is difficult with the structures known to the art and, therefore, a piezoelectric actuator which is reliably resistant to detrimental external influences and has excellent durability is still required.

SUMMARY OF THE INVENTION

The present invention was arrived at in light of the problems of the prior art and has, as its object, to provide a piezoelectric actuator with excellent durability.

A first aspect of the present invention is a piezoelectric actuator having a piezoelectric element in which a plurality of piezoelectric layers that expand in accordance with an applied voltage, and internal electrode layers for supplying an applied voltage, are alternately laminated, and at least a part of the side surfaces is covered by an external packaging resin, the piezoelectric element being housed in a sealed container that substantially isolates it from the external atmosphere, and in which the internal atmosphere is replaced by an inert gas.

In the first aspect of the present invention, the piezoelectric element provided with an external packaging resin is filled with an inert gas and housed in a sealed container that substantially isolates it from the outside air. As the external packaging resin does not come into direct contact with the outside air, and there is very little or no oxygen within the sealed container, it is difficult for oxidation to occur in the external packaging resin.

Also, because the side surfaces of the piezoelectric element are covered by the external packaging resin, impacts from the outside are absorbed by the external packaging resin, and cracking and breakage of the piezoelectric element can be prevented. Also, it is very difficult for moisture to enter the piezoelectric element from the outside and creeping discharge, on the sides of the piezoelectric element, is prevented. In addition, these effects arise from the external package resin being resistant to deterioration due to oxidation, thus preserving the piezoelectric element over a long period of time.

A second aspect of the present invention is a piezoelectric actuator having a piezoelectric element in which a plurality of piezoelectric layers that expand in accordance with an applied voltage, and internal electrode layers for supplying an applied voltage, are alternately laminated, and at least a part of the side surfaces is covered by an external packaging resin, the piezoelectric element being housed in a sealed container that substantially isolates it from the external atmosphere, and the external packaging resin including an antioxidant.

In the second aspect of the present invention, an external packaging resin is provided on the side surfaces of the piezoelectric element housed in a sealed container, and this external packaging resin includes an antioxidant. Accordingly, oxygen in the external packaging resin is trapped by the antioxidant and the external packaging resin does not deteriorate due to oxygen.

Also, because the piezoelectric element is housed in a sealed container, oxygen can be prevented from entering the sealed container to the extent that these is too much for the antioxidant to trap.

Further, because the side surfaces of the piezoelectric element are covered by the external packaging resin, impacts from the outside are absorbed by the external packaging resin, and cracking and breakage of the piezoelectric element can be prevented. Also, it is very difficult for moisture to enter the piezoelectric element from the outside and creeping discharge, on the sides of the piezoelectric element, is prevented. In addition, these effects arise from the external package resin being resistant to deterioration due to oxidation, thus preserving the piezoelectric element over a long period of time.

A third aspect of the present invention is a piezoelectric actuator having a piezoelectric element in which a plurality of piezoelectric layers that expand in accordance with an applied voltage, and internal electrode layers for supplying an applied voltage, are alternately laminated, and at least a part of the side surfaces are covered by an external packaging resin, the piezoelectric element being housed in a sealed container that substantially isolates it from the external atmosphere, in which the internal atmosphere is replaced by an inert gas, and the external packaging resin includes an antioxidant.

In the third aspect of the present invention, the piezoelectric element provided with an external packaging resin is filled with an inert gas and housed in a sealed container that substantially isolates it from the outer air. As the external packaging resin does not come into direct contact with the outside air, and there is very little or no oxygen within the sealed container, it is difficult for any oxidation at all to occur in the external packaging resin.

Also, because the external packaging resin includes an antioxidant, oxygen in the external packaging resin is trapped by the antioxidant and the external packaging resin does not deteriorate due to oxygen.

Further, because the side surfaces of the piezoelectric element are covered by the external packaging resin, impacts from the outside are absorbed by the external packaging resin, and cracking and breakage of the piezoelectric element can be prevented. Also, it is very difficult for moisture to enter the piezoelectric element from the outside and creeping discharge, on the sides of the piezoelectric element, is prevented. In addition, these effects arise from the external package resin being resistant to deterioration due to oxidation, thus preserving the piezoelectric element over a long period of time.

As explained above, according to the present invention, a piezoelectric actuator with excellent durability can be provided.

DESCRIPTION OF THE PREFERRED EMBODIMENTS

In the first to third aspects of the present invention, an external packaging resin is preferably provided on all of the side surfaces of the piezoelectric element. In many cases, as shown in FIG. 1 to FIG. 4 described above, an internal electrode layer is exposed on the side surfaces of the piezoelectric element and, by covering the side surfaces with the external packaging resin, creeping discharge from the internal electrode layer exposed on the side surfaces can be prevented. The external packaging resin can be also be provided so as to partially cover the side surfaces of the piezoelectric element.

Also, because it is necessary for the above external packaging resin to follow the movements of the piezoelectric element, which expands and contracts as a result of excitation, it is preferably made from a soft, elastic material. Further, heat resistance is necessary, depending on the environment where the piezoelectric actuator is being used.

Further, the sealed container has a structure that corresponds to the expansion and contraction of the piezoelectric element, and can substantially isolate the piezoelectric element from the outside air. In addition, the airtightness of the sealed container can be realized using a sealing compound, an O-ring, a grommet, or the like (refer to embodiments 1 to 4).

Moreover, the above sealed container is preferably constructed from a material with excellent durability characteristics, such as thermal resistance, oil resistance, oxidation resistance and the like, according to the environment in which the piezoelectric actuator is to be used.

Also, in the first aspect of the present invention, the external packaging resin is preferably one or more types selected from among silicone, polyimide, urethane and epoxy.

As these resins are resistant to heat, a piezoelectric actuator with excellent thermal resistance can be attained.

In addition, in the first aspect of the present invention, the concentration of the inert gas in the internal atmosphere is preferably 85% or more.

In this case, as the amount of oxygen in the sealed container is sufficiently small, oxidation of the external packaging resin can be more effectively prevented.

If the concentration of the inert gas is less than 85%, there is the possibility of a piezoelectric actuator with an external packaging resin that deteriorates due to oxidation, cannot withstand prolonged use, and makes use in high temperature environments, where oxidation progresses quickly, difficult.

Also, replacing the internal atmosphere totally with an inert gas is even more preferable.

Further, in the first aspect of the present invention, the oxygen concentration in the internal atmosphere of the sealed container is preferably 0.1% or less.

In this case, because the amount of oxygen in the internal atmosphere is sufficiently small, oxidation of the external packaging resin can be prevented.

If the oxygen concentration is more than 0.1%, there is the possibility of a piezoelectric actuator with an external packaging resin that deteriorates due to oxidation, cannot withstand prolonged use, and makes usage in high temperature environments, where oxidation progresses quickly, difficult.

In addition, it is even more preferable if the oxygen concentration of the internal atmosphere is 0.

Also, in the second aspect of the present invention, the external packaging resin is preferably made from silicone, and the antioxidant is preferably one type or more selected from among iron oxide, cerium oxide, titanium oxide and carbon.

Silicone, as well as having excellent heat resistance, has high elasticity. Consequently, a piezoelectric actuator having excellent heat resistance can be attained. Also, because silicone can follow the expansion and contraction of the piezoelectric element, the expansion and contraction of the piezoelectric element is not inhibited.

In addition, since the above antioxidant is a material that does not easily react with the silicone, the external packaging resin does not easily deteriorate.

Further, in the second aspect of the present invention, the external packaging resin is preferably made from one or more types selected from polyimide, urethane and epoxy, and the antioxidant is preferably one type or more selected from among iron oxide, cerium oxide, titanium oxide and carbon.

Each of the resins described above, as well as having excellent heat resistance, have high elasticity. Consequently, a piezoelectric actuator having excellent heat resistance can be attained, and because the external packaging resin can follow the expansion and contraction of the piezoelectric element, the expansion and contraction of the piezoelectric element is not inhibited.

In addition, as the above antioxidant is a material that does not easily react with the any of the above resins, the external packaging resin does not easily deteriorate.

Also, in the second aspect of the present invention, the amount of the antioxidant contained in the above external packaging resin is preferably 1 to 30% by weight. Deterioration of the external packaging resin due to oxidation can thereby be reliably prevented.

If it is less than 1% by weight, the amount of antioxidant is too small and there would therefore be the possibility that oxidation of the external packaging resin will occur. If it is over 30% by weight, the elasticity of the external packaging resin will be lost, leading to the possibility of the external packaging resin cracking and falling off the piezoelectric element or the like when the piezoelectric element is driven.

In a third aspect of the present invention, the above external packaging resin is preferably a dual layer structure, the inner layer being epoxy and the outer layer being silicone containing an antioxidant.

Because the inner layer is made from epoxy, it forms an excellent bond with the piezoelectric element, and has excellent responsiveness to expansion and contraction of the piezoelectric element. And since the outer layer is silicone containing an antioxidant, it does not oxidize and deteriorate easily. In addition, because oxygen is inactivated by the antioxidant of the outer layer, the inner layer also does not oxidize easily.

As the antioxidant included in the above silicone, iron oxide, cerium oxide, titanium oxide, carbon and the like can be used, as described above.

In the third aspect of the present invention, the above external packaging resin is preferably a dual layer structure, the inner layer being silicone and the outer layer being silicone containing an antioxidant.

Because the inner layer is made from silicone, it has high elasticity, forms an excellent bond with the piezoelectric element, and has excellent responsiveness to expansion and contraction of the piezoelectric element. And since the outer layer is silicone containing an antioxidant, it does not oxidize and deteriorate easily. In addition, because oxygen is inactivated by the antioxidant of the outer layer, the inner layer also does not oxidize easily.

As the antioxidant included in the above silicone, iron oxide, cerium oxide, titanium oxide, carbon and the like can be used, as described above.

Also, the piezoelectric actuator according to the present invention can be used in an environment having a temperature of 100° C. or more, continuously, for 100 hours or more.

In addition, it can be used in a state where it is exposed to fuels in a fuel passage through which fuel flows.

Because it is provided with these qualities, the piezoelectric actuator according to the present invention can be used as a drive source for fuel injection systems installed in engines for automobiles or many other types of vehicles. The piezoelectric actuator, compared to prior art actuators as typified by electromagnetic type actuators, has a higher response speed, more precise displacement, and higher resolving power, therefore, when using it as a drive source for a fuel infection system, performance such as low fuel consumption, low waste gas and high output can be attained.

The fuel described above is often a composition composed mainly of carbon, to which is bonded hydrogen and oxygen. Others include nitrogen, sulfur, ash, and the like. Specifically, the fuels are gasoline, kerosene, gas oil, fuel oil, alcohol, and the like.

In an environment of less than 100° C., where durability at 100° C. or over is less than 100 hours, durability is low and there is the possibility that usage as a drive source in a fuel injection system is troublesome.

Embodiments of the present invention will be explained below using the drawings.

(First Embodiment)

The piezoelectric actuator according to the present invention will be explained using FIGS. 1 to 4.

The piezoelectric actuator 1 of the present embodiment, as shown in FIGS. 1 to 4, has a piezoelectric element 2 with alternately laminated piezoelectric layers 21 and 22 that expand according to an applied voltage and internal electrode layers 210 and 220 for supplying an applied voltage, and an external packaging resin 25 that covers all of the side surfaces (reference numbers 201, 202, and the like) of the piezoelectric element 2, the piezoelectric element 2 being housed in a sealed container 11 that substantially isolates it from the outer air and whose internal atmosphere 19 is replaced by an inert gas.

A detailed explanation follows below.

Figure 2:
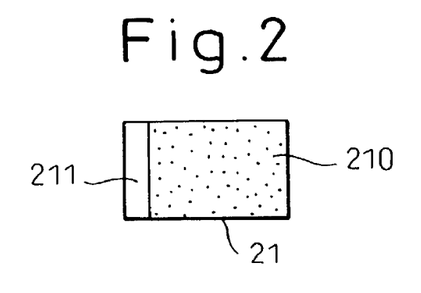
FIG. 2 is a plan view of the piezoelectric layer and internal electrode layer according to the first embodiment.
Figure 3:
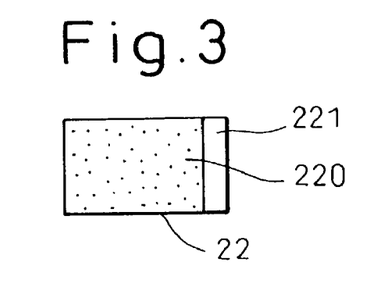
FIG. 3 is a plan view of a laminated piezoelectric layer and internal electrode layer adjacent to the piezoelectric layer of FIG. 2 according to the first embodiment.
Figure 4:
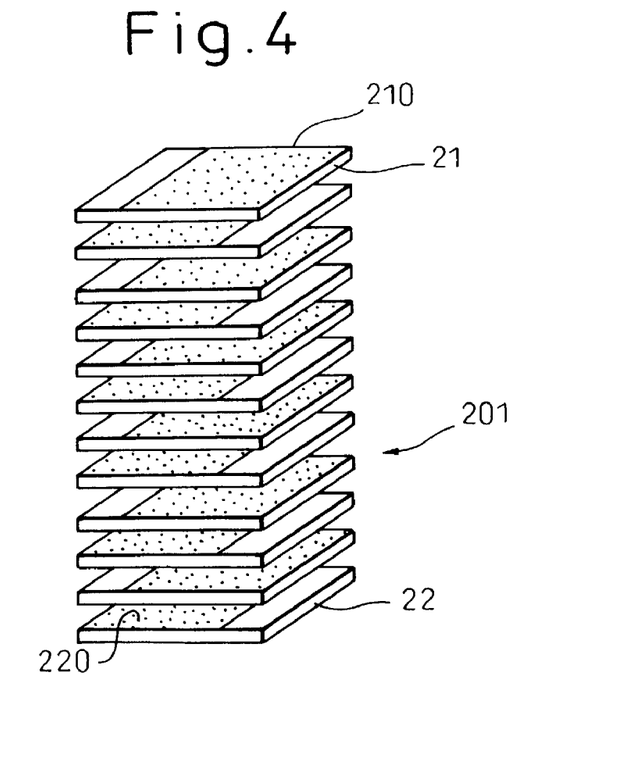
FIG. 4 is a developed perspective view of the piezoelectric element according to the first embodiment.

In the piezoelectric element 2 of the piezoelectric actuator 1, as shown in FIGS. 2 to 4, internal electrode layers 210 and 220 are formed alternately between the piezoelectric layers 21 and 22 so that positive and negative charges can be alternately applied to the piezoelectric layers 21 and 22.

As shown in FIG. 2, the inner electrode layer 210 adjacent to the piezoelectric layer 21 has an unformed electrode portion 211 on the left side of the drawing, and as shown in FIG. 3, the inner electrode layer 220 adjacent to the piezoelectric layer 22 has an unformed electrode portion 221 on the right side of the drawing.

One inner electrode layer 210 is arranged exposed to one side surface 201 of the piezoelectric element 2, and the other inner electrode layer 220 is arranged exposed to the other side surface 202.

Figure 1:
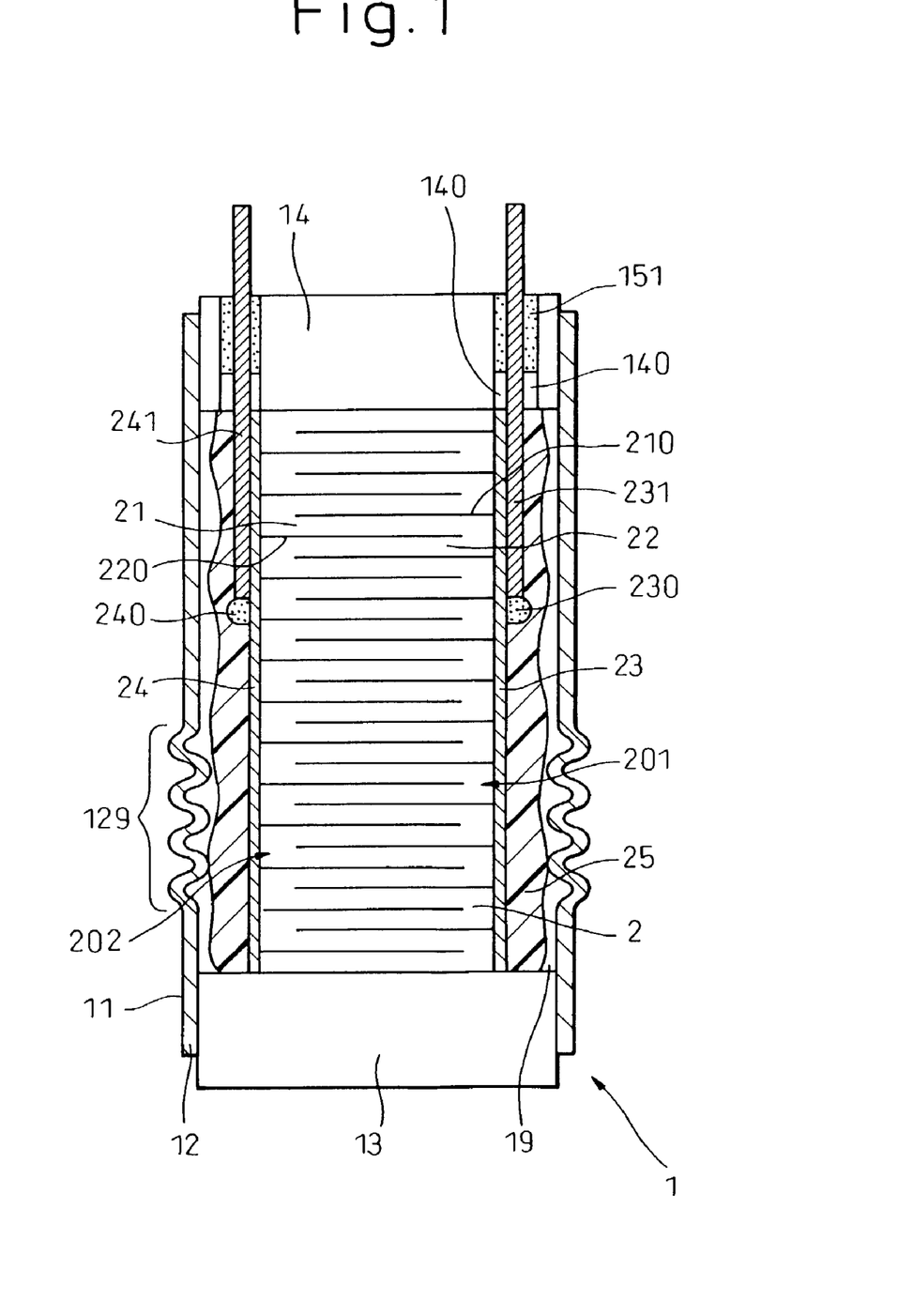
FIG. 1 is a longitudinal section view of the piezoelectric actuator according to a first embodiment.

As shown in FIG. 1, on the side surfaces 201 and 202 of the piezoelectric element 2, the end portions of the exposed inner electrode layers 210 and 220 respectively have side surface electrodes 23 and 24 formed from a precious metal such as silver or the like so as to conduct electricity.

External electrodes 231 and 241 having a circular cross section and formed of stainless steel rods are linked to these side surface electrodes 23 and 24 using a conductive bonding agent 230 and 240 of epoxy resin. These external electrodes 231 and 241 are connected to a drive source not shown in the drawings.

Also, as shown in FIG. 1, the side surfaces 201 and 202 of the piezoelectric element 2, and all of the side surfaces not shown in the drawings from FIG. 1 onwards, are formed by a dipping method, and are covered by the external packaging resin 25 made of silicone to an average thickness of 0.5 mm. In addition, part of the side surface electrodes 23 and 24 and part of the external electrodes 231 and 241 are embedded in the inner portion of the external packaging resin 25.

The sealed container 11 that houses the above piezoelectric element 2 will be described.

The sealed container 11 is formed from a tube shaped metal case 12 having a circular cross section, an upper plate 14 and a lower plate 13, the upper plate 14 and lower plate 13 welded to the metal case 12 to form an airtight seal.

Also, as shown in FIG. 1, the metal case 12, so as not to inhibit the expansion and contraction of the piezoelectric element 2, has a bellows structure at the portion indicated by the reference number 129.

Further, the upper plate 14 described above has through holes 140 for the external electrodes 231 and 241. The cross sectional shape of these through holes 140 is circular. In addition, the gap between the side surfaces of these through holes 140 and the external electrodes 231 and 241 is sealed by a sealing compound 151 of silicone resin or the like.

Furthermore, in attaching the piezoelectric element 2 to the sealed container 11 to form the piezoelectric actuator, firstly the lower plate 13 is welded to the metal case 12, then the piezoelectric element 2 is housed in the metal case 12. Then, the upper plate 14 is temporarily placed in a predetermined position of the metal case 12, while the external electrodes 231 and 241 are inserted through the through holes 140 of the upper plate 14.

Thereafter, the upper plate 14 and the metal case 12 are welded closed, and the inner atmosphere 19 of the metal case 12 (in other words the sealed container 11) is replaced with nitrogen gas by a method of extracting the air by a vacuum pump from the gaps between the through holes 140 and the external electrodes 231 and 241, then introducing nitrogen gas. Thereafter, a sealing compound 151 is inserted into the gaps between the through holes 140 and the external electrodes 231 and 241.

By this means, the interior of the sealed container 11 has been replaced by the nitrogen gas, which is an inert gas, and a piezoelectric actuator 1, whose piezoelectric element 2 is housed in an internal atmosphere 19 substantially isolated from the outer air by means of welding and the sealing compound 151, is attained.

The durability test described below was performed on the piezoelectric actuator 1 having the structure of the present embodiment.

The piezoelectric actuator 1 was maintained at a temperature of 100° C., and a voltage was applied from the external electrodes 231 and 241 to drive the piezoelectric element 2 for 100 hours so that the displacement factor in the laminate direction was 0.01%.

Creeping discharge was not generated in the piezoelectric element 2 both before and after the durability test. Also, oxidation deterioration did not occur in the external packaging resin 25. Further, the percentage elongation after fracture of the external packaging resin 25 was 180% before the durability test and 170% after the durability test.

As a comparison, a piezoelectric actuator having the same structure as the first embodiment, but without the gap between the metal case and upper plate sealed, and without the gap between the upper plate through holes and the external electrodes sealed, was prepared and the same durability test performed.

The result was oxidation deterioration of the external packaging resin and the percentage elongation after fracture dropped from 180% before the test to 120% after the test. Also, due to the deterioration of the external packaging resin, the problem of part of the external packaging resin peeling off from the piezoelectric element occurred.

Further, a piezoelectric actuator with a piezoelectric element housed in the sealed container according to the first embodiment, without the external packaging resin, was prepared and the same durability test performed. The result was that creeping discharge occurred 0.5 hours after the start of the test and driving of the piezoelectric element became impossible.

In other words, the piezoelectric actuator could no longer function as such.

The operation effects of the present embodiment will be described.

The piezoelectric actuator 1 of the present embodiment has a piezoelectric element 2 provided with external packaging resin 25 and filled with an inert gas, housed in a sealed container 11 that substantially isolates it from the outer air. Because the external packaging resin 25 does not come into direct contact with the outer air, and there is no, or extremely little, oxygen within the sealed container 25, it is difficult for oxidation deterioration of the external packaging resin 25 to occur.

Also, because all of the side surfaces of the piezoelectric element 2 are covered by the external packaging resin 25, impacts from the outside are absorbed by the external packaging resin, and cracking and breakage of the piezoelectric element can be prevented. Also, it is very difficult for moisture to enter the piezoelectric element 2 from the outside, so that creeping discharge on the sides of the piezoelectric element 2 is prevented. In addition, these effects arise from the external package resin 25 being resistant to deterioration due to oxidation, thus preserving the piezoelectric element over a long period of time.

From the above description, it can be understood that the piezoelectric actuator according to the present invention attains the effects associated with excellent durability.

Figure 5:
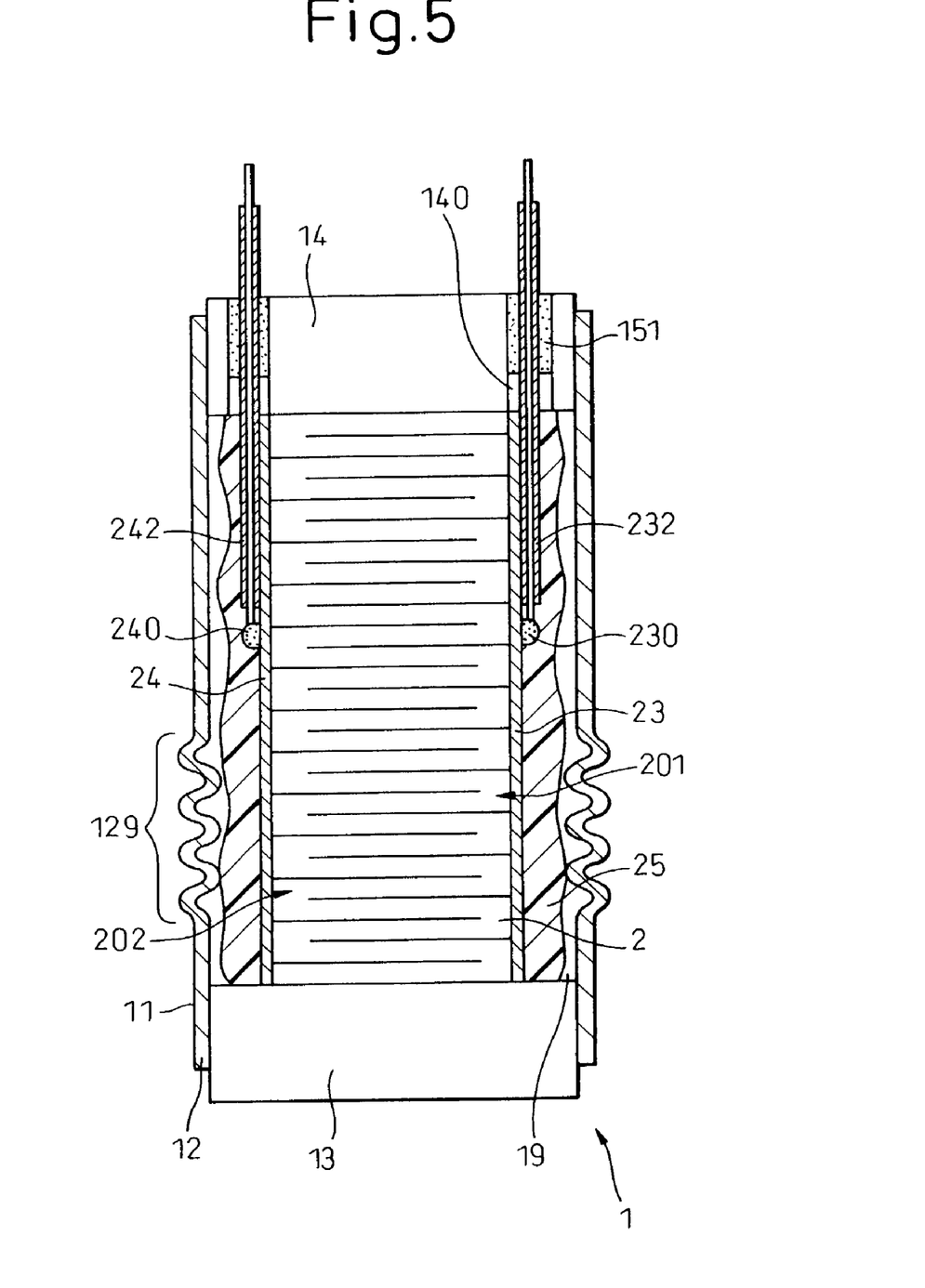
FIG. 5 is a view of the piezoelectric actuator using a resin covered lead wire as an external electrode, according to the first embodiment.

Also, although the external electrodes according to the present embodiment are constructed from stainless steel rods, as shown in FIG. 5, resin-covered lead wires (stranded wires) 232 and 242 can be used as the external electrodes. Although there are gaps between the stranded wires within the resin covering, because the periphery of the resin coating, the resin-covered lead wires 232 and 242 are arranged in the through holes 140 of the upper plate 14, the sealed container 11 is substantially isolated from the outer air by being sealed with a sealing agent 152.

(Second Embodiment)

Figure 6:
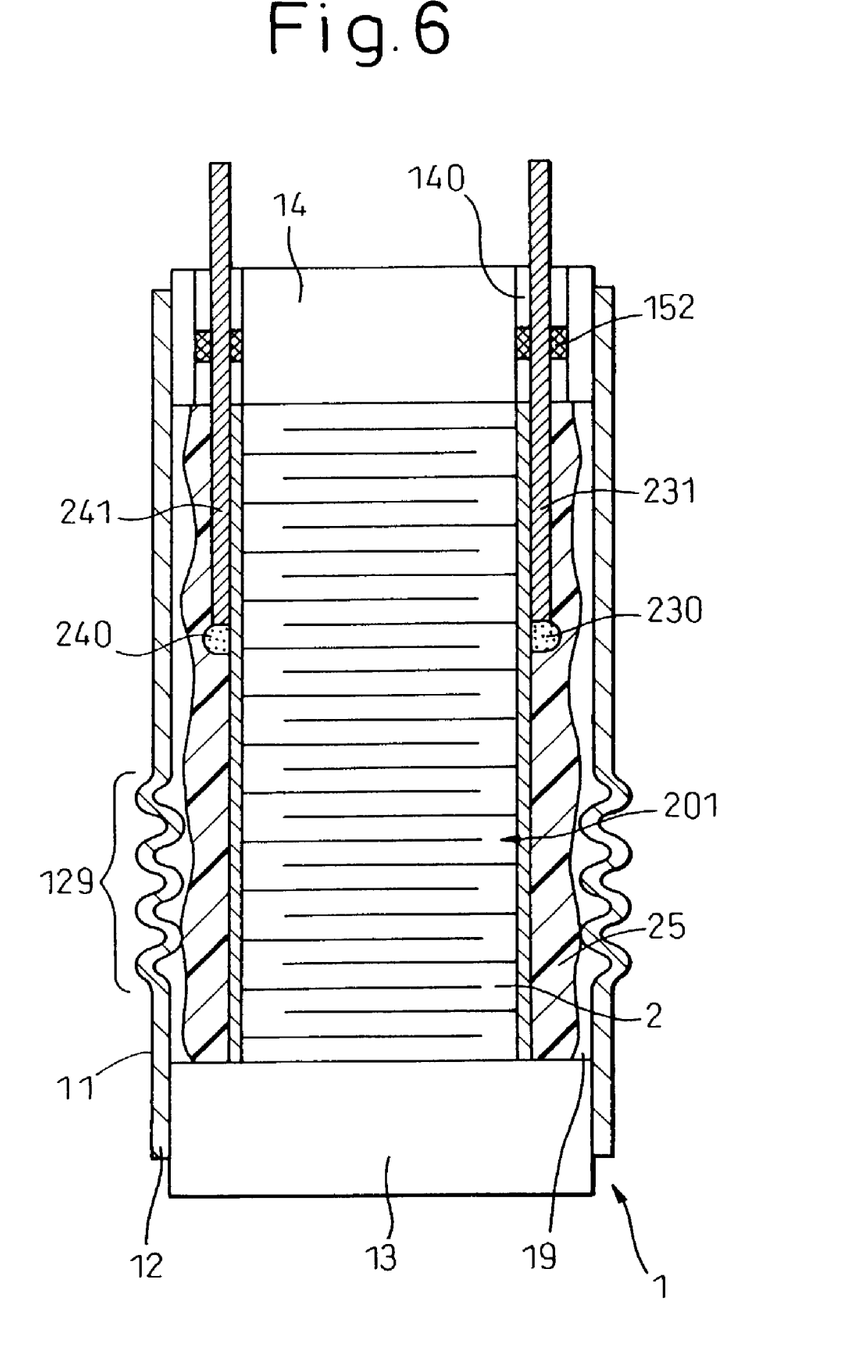
FIG. 6 is a longitudinal section view of a piezoelectric actuator of a second embodiment, having a sealed container whose through hole is sealed by O-rings.

A piezoelectric actuator 1 according to the present embodiment is of the same structure as the first embodiment, but the structure for sealing the through holes 140 of the upper plate 14 is different.

As shown in FIG. 6, the through holes 140 are annular and O-rings are interfitted therein. Everything else is the same as in the first embodiment.

With the sealed container 11 having an O-ring structure, the sealed container 11 is still substantially isolated from the outside air. Thus, it is still difficult for oxidation of the external packaging resin 25 to occur.

(Third Embodiment)

Figure 7:
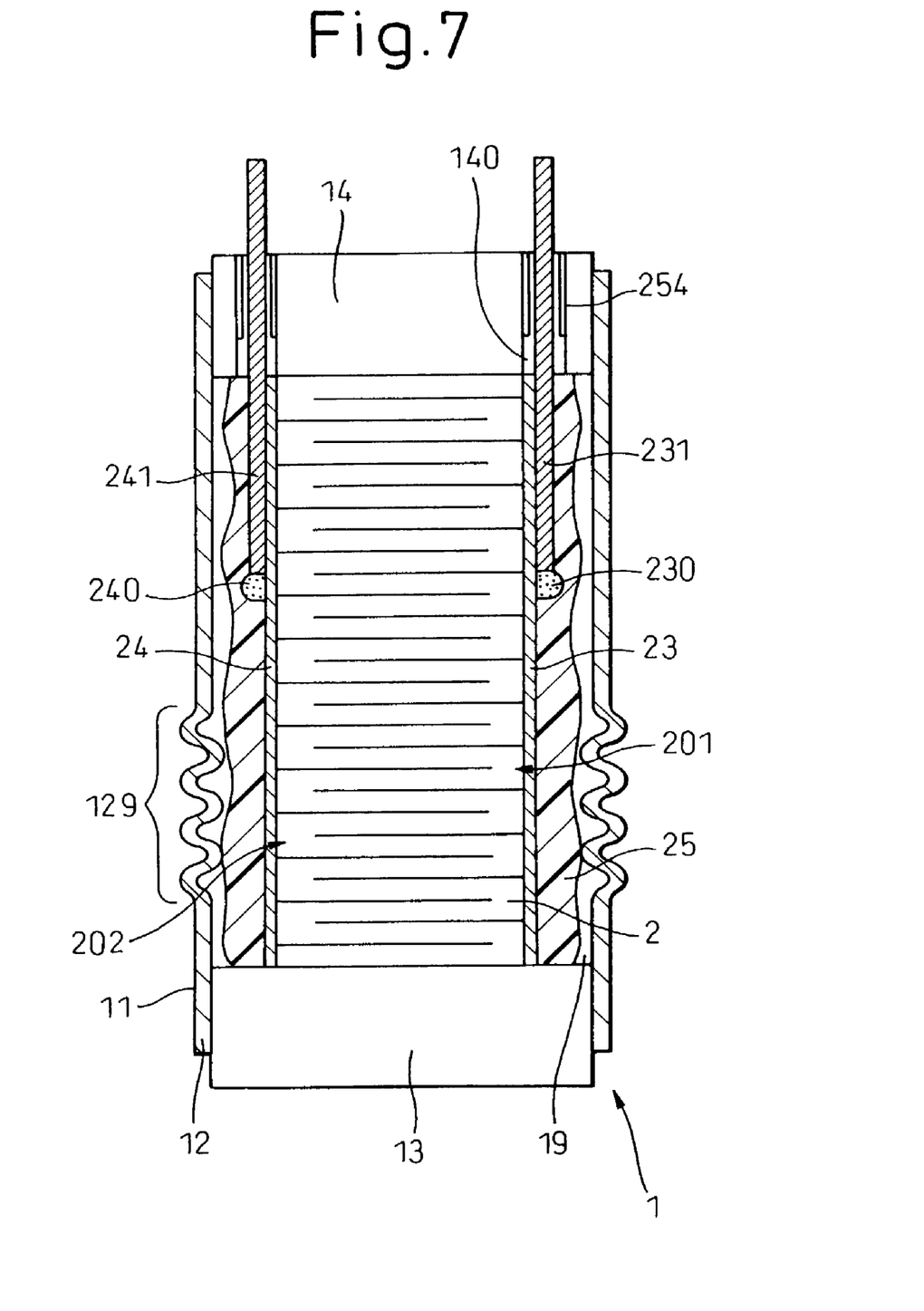
FIG. 7 is a longitudinal section view of a piezoelectric actuator of a third embodiment, having a sealed container whose through hole is sealed by grommets.

The piezoelectric actuator 1 according to the present embodiment has the same structure as the first embodiment, but the structure for sealing the through holes 140 of the upper plate 14 is different.

As shown in FIG. 7, the through holes 140 are annular and grommets 254 are inserted therein. Everything else is the same as in the first embodiment.

With the sealed container 11 having a grommet structure, the sealed container 11 is still substantially isolated from the outside air. Thus, it is still difficult for oxidation of the external packaging resin 25 to occur.

(Fourth Embodiment)

Figure 8:
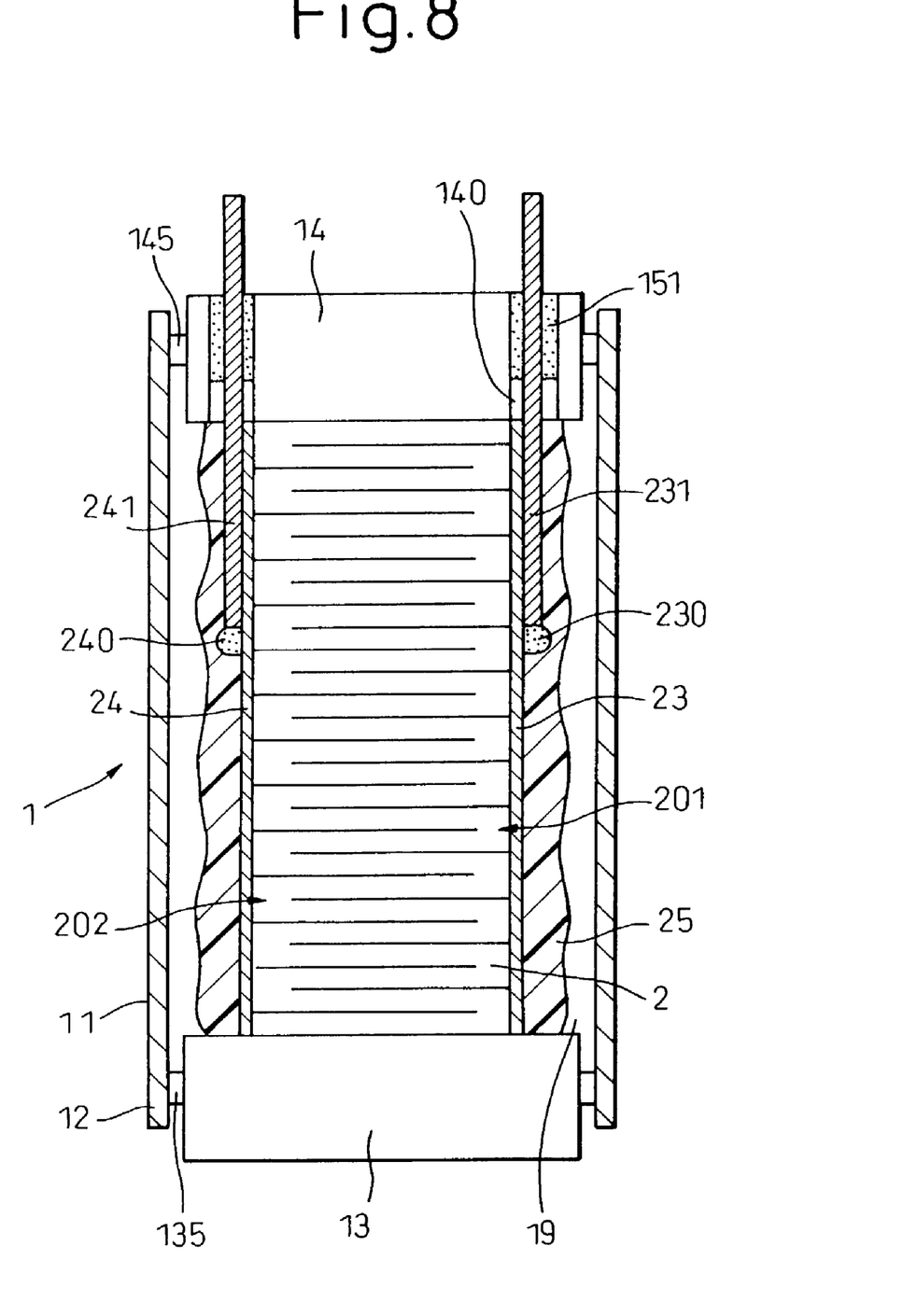
FIG. 8 is a longitudinal section view of a piezoelectric actuator of a fourth embodiment having a sealed container, a gap between an upper plate, a lower plate and a steel case thereof being sealed by O-rings.

A piezoelectric actuator 1 according to the present embodiment is of the same structure as the first embodiment, but as shown in FIG. 8, has a structure wherein the piezoelectric element 2 is housed in a sealed container 11 with O-rings 135 and 145 arranged between the upper and lower plates 14 and 13 and the metal case 12.

As shown in FIG. 8, the above sealed container 11 has the upper plate 14 and the lower plate 13 fixed to the metal case 12 by O-rings 135 and 145. As a result, it is constructed so that the upper plate 14 or the lower plate 13 can move together with the expansion and contraction of the actuator. Everything else is the same as in the first embodiment.

With the O-ring structure of the present embodiment wherein the space between the upper and lower plates 14 and 13 and the metal case 12 is sealed, the sealed container 11 is still substantially isolated from the outside air, and it is difficult for oxidation of the external packaging resin 25 to occur.

Figure 9:
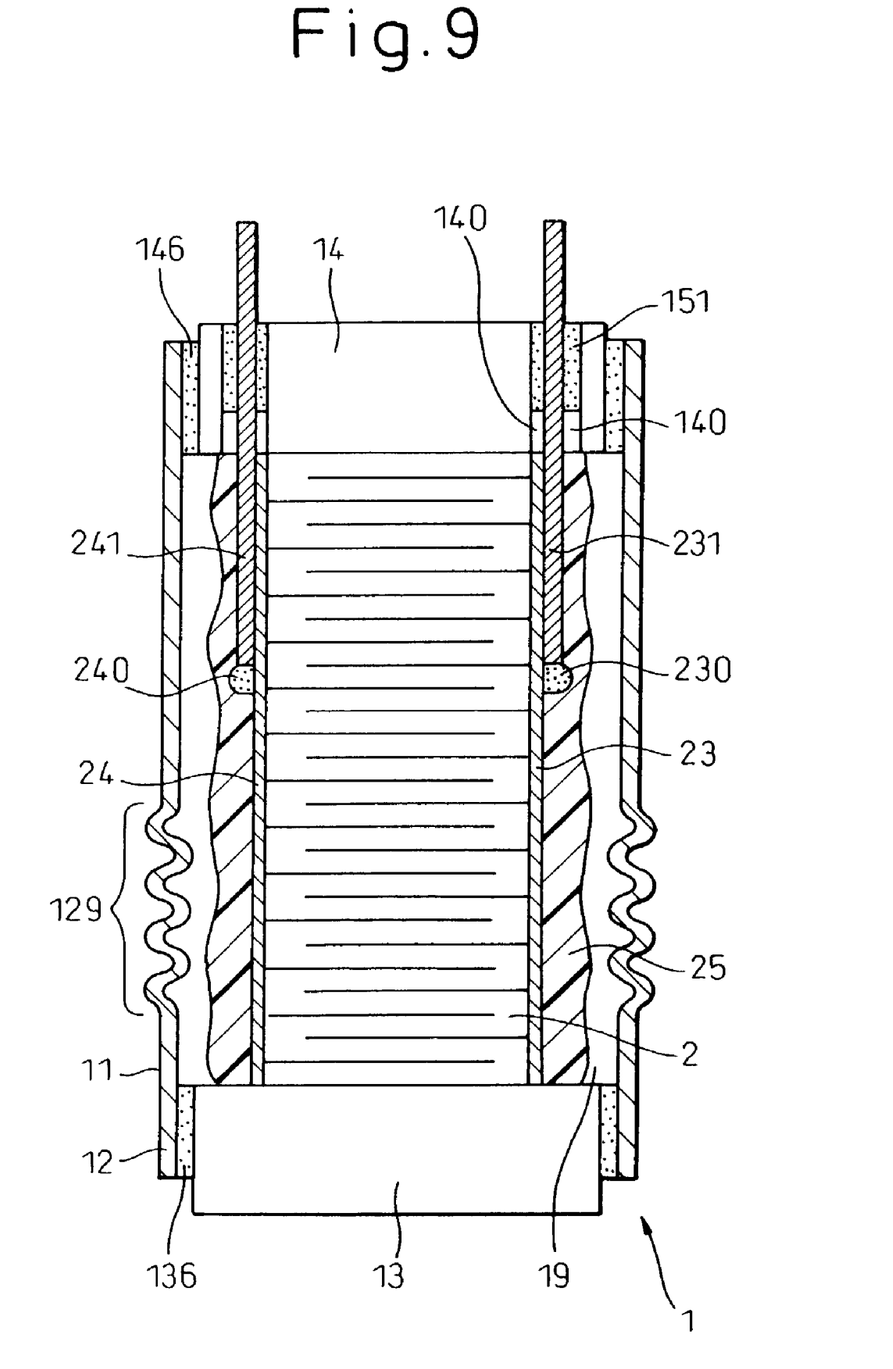
FIG. 9 is a longitudinal section view of a piezoelectric actuator of a fourth embodiment having a sealed container, a gap between an upper plate, a lower plate and a steel case thereof being sealed by a sealing compound.

Also, as shown in FIG. 9, instead of the O-rings 135 and 145, a sealing compound (bonding solution) 136 and 146 is used to bond the upper and lower plates 14 and 13 and the metal case 12, thus forming a sealed container 11 substantially isolated from the outside air, and making it difficult for oxidation of the external packaging resin 25 to occur.

(Fifth Embodiment)

The piezoelectric actuator 1 according to the present embodiment has the same structure as the first embodiment, but an external packaging resin that includes an antioxidant is used as the external packaging resin.

The external packaging resin of the present embodiment is formed of 80% silicone by weight and 20% by weight of iron oxide powder. Also, the iron oxide powder is dispersed within the silicone. In addition, the iron oxide is bivalent. Everything else is the same as in the piezoelectric actuator structure of the first embodiment, except that the inside of the sealed container is normally filled with air.

Also, the same durability test as in the first embodiment was performed on the piezoelectric actuator of the present embodiment. The result was that oxidation deterioration of the external packaging resin did not occur by and large, and the percentage elongation after fracture of the external packaging resin was 180% before the durability test and remained 180% after the durability test.

In other words, if a prior art piezoelectric actuator, where oxygen within the sealed container comes into contact with the silicone, the oxygen cuts the principle chain of the silicone, deteriorating the silicone and reducing the elasticity of the external packaging resin.

However, where iron oxide is included in the external packaging resin as in the piezoelectric actuator of the present embodiment, because the oxygen radicals are absorbed by the iron oxide, cutting of the principle chain of the silicone does not occur. In this manner, because the antioxidant renders the oxygen inert, deterioration of the external packaging resin can be prevented.

Otherwise, the operational effects are the same as the first embodiment.

Also, the atmosphere of the above sealed container can be replaced by an inert gas such as nitrogen or the like as in the first embodiment.

Further, as the above external packaging resin, a polyimide or carbon powder, as an antioxidant, can be used.

Both piezoelectric actuators, where the same durability test as described above was performed, had essentially no occurrence of oxidation deterioration in the external packaging resin, and the percentage elongation after fracture both before and after the test was 110%, exhibited no substantial change.

(Sixth Embodiment)

Figure 10:
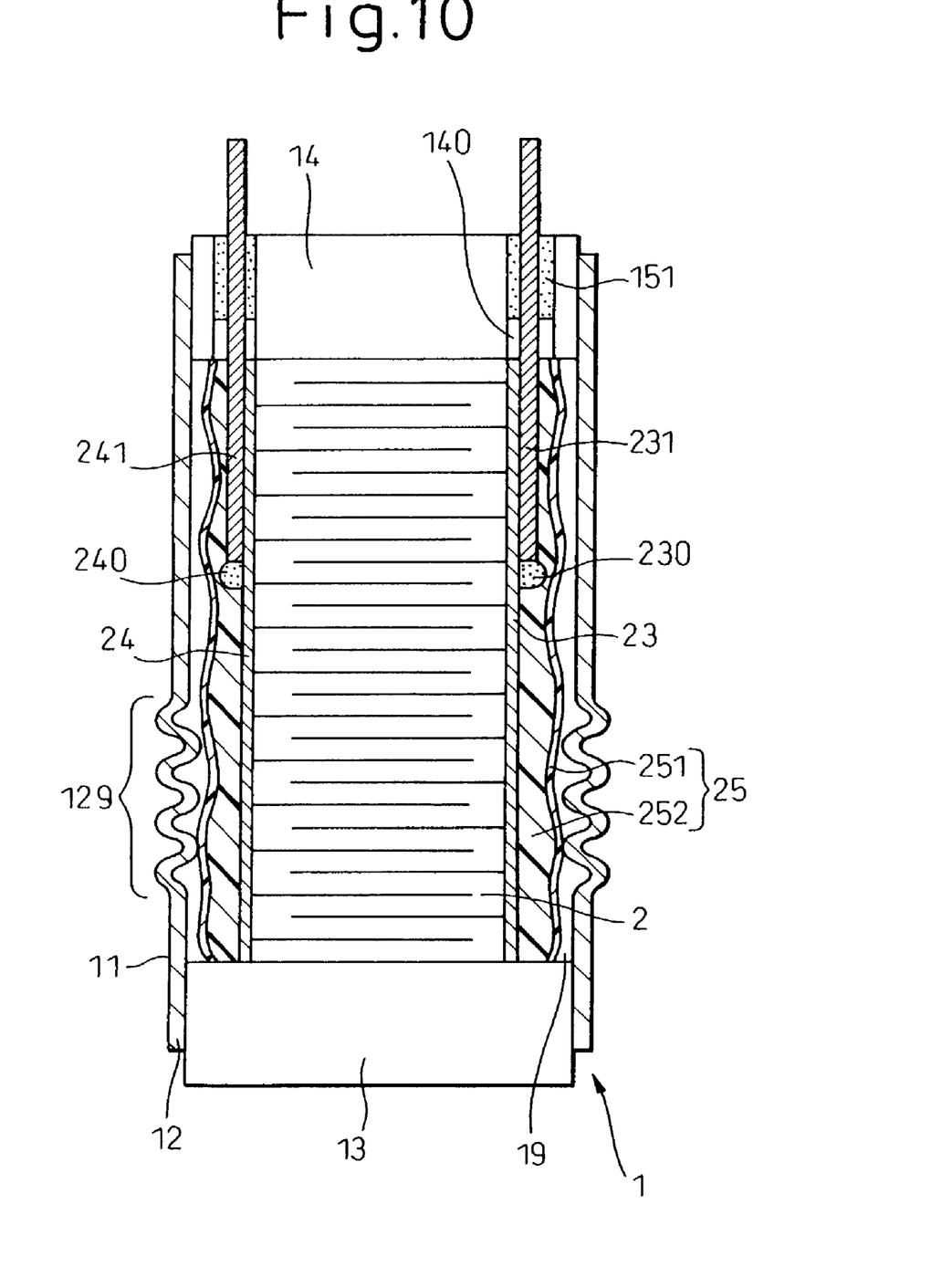
FIG. 10 is a longitudinal section view of a piezoelectric actuator of a sixth embodiment comprising a piezoelectric element having a dual layer structure external packaging resin.

The piezoelectric actuator 1 of the present embodiment, as shown in FIG. 10, has a dual layer structure external packaging resin 25, the inner layer 252 being epoxy, and the outer layer 251 being silicone including iron oxide as an antioxidant. Otherwise, the structure is the same as in the first embodiment.

Since the inner layer 252 is formed of epoxy, the Young's modulus is low, adhesion to the piezoelectric element 2 is excellent, and response to elongation and contraction of the piezoelectric element 2 is also excellent. Because the outer layer 251 is silicone including an antioxidant, it does not easily deterioration due to oxidation. Further, because oxygen is rendered inert by the antioxidant of the outer layer 251, oxidation deterioration of the inner layer can be prevented.

Also, where the inner layer 252 is formed from silicone and the outer layer 251 is formed by silicone including iron oxide as an antioxidant, the same effects as described above can be attained.

What is claimed is:

1. A piezoelectric actuator having a piezoelectric element in which a plurality of piezoelectric layers that expand in accordance with an applied voltage, and internal electrode layers for supplying an applied voltage, are alternately laminated, and at least a part of side surfaces thereof is covered by an external packaging resin, wherein:

the piezoelectric element is housed in a sealed container that substantially isolates it from an external atmosphere; and the external packaging resin is a dual layer structure, wherein an inner layer of said dual layer structure does not include an antioxidant and an outer layer of said dual layer structure includes an antioxidant.

2. The piezoelectric actuator according to claim 1, wherein the external packaging resin is formed from silicone, and the antioxidant is one type or more selected from among iron oxide, cerium oxide, titanium oxide, and carbon.

3. The piezoelectric actuator according to claim 1, wherein the external packaging resin is formed from one type or more selected from among polyimide, urethane and epoxy, and the antioxidant is one type or more selected from among iron oxide, cerium oxide, titanium oxide, and carbon.

4. The piezoelectric actuator according to claim 1, installed continuously for 100 hours in an environment having a temperature of 100° C.

5. The piezoelectric actuator according to claim 1, wherein said inner layer comprises epoxy and said outer layer comprises silicone.

6. The piezoelectric actuator according to claim 5, wherein said outer layer includes iron oxide as an antioxidant.

7. The piezoelectric actuator according to claim 1, wherein said inner layer and said outer layer each comprise silicone.

8. The piezoelectric actuator according to claim 7, wherein said outer layer includes iron oxide as an antioxidant.

* * * * *